US011317539B2

(12) United States Patent
Huang et al.

(10) Patent No.: US 11,317,539 B2
(45) Date of Patent: Apr. 26, 2022

(54) HYBRID HEAT SINK

(71) Applicant: ARRIS Enterprises LLC, Suwanee, GA (US)

(72) Inventors: Chien-Cheng Huang, Poway, CA (US); Chih-Hao Chien, Taoyuan (TW); Xue-Hong Wu, New Taipei (TW)

(73) Assignee: ARRIS ENTERPRISES LLC, Suwanee, GA (US)

( * ) Notice: Subject to any disclaimer, the term of this patent is extended or adjusted under 35 U.S.C. 154(b) by 0 days.

(21) Appl. No.: 17/066,991

(22) Filed: Oct. 9, 2020

(65) Prior Publication Data

US 2021/0112681 A1   Apr. 15, 2021

Related U.S. Application Data

(60) Provisional application No. 62/913,875, filed on Oct. 11, 2019.

(51) Int. Cl.
  *H05K 7/20* (2006.01)

(52) U.S. Cl.
  CPC .................. *H05K 7/2039* (2013.01)

(58) Field of Classification Search
  CPC ............ H05K 7/20409; H05K 7/2039; H05K 7/20418; H05K 7/20154; H05K 7/20436; H05K 7/20136; H05K 2201/066; H05K 7/20127
  See application file for complete search history.

(56) References Cited

U.S. PATENT DOCUMENTS

| | | | | |
|---|---|---|---|---|
| 2,984,774 A | * | 5/1961 | Race ...................... | H05K 11/02 257/722 |
| 5,880,930 A | * | 3/1999 | Wheaton ............ | H05K 7/20436 361/690 |
| 7,315,450 B2 | * | 1/2008 | Ishii ...................... | H01L 23/467 165/185 |
| 10,289,173 B2 | * | 5/2019 | Szeremeta ........... | G11B 25/043 |
| 2006/0032617 A1 | * | 2/2006 | Chen ........................ | F28F 3/02 165/104.33 |
| 2006/0158850 A1 | * | 7/2006 | Lee ........................ | H01L 23/427 361/700 |
| 2008/0055854 A1 | * | 3/2008 | Zhou ..................... | H01L 23/427 361/700 |
| 2010/0073880 A1 | * | 3/2010 | Liu ..................... | F28D 15/0275 361/700 |
| 2010/0078154 A1 | * | 4/2010 | Li .......................... | H01L 23/427 165/104.31 |
| 2012/0222841 A1 | * | 9/2012 | Zhu .......................... | G06F 1/20 165/104.34 |
| 2013/0269920 A1 | * | 10/2013 | Taketomi ........... | H05K 7/20418 165/185 |
| 2016/0044827 A1 | * | 2/2016 | Proctor .............. | H05K 7/20127 361/692 |
| 2017/0181265 A1 | * | 6/2017 | Hunt .................... | H05K 1/0216 |
| 2017/0301375 A1 | * | 10/2017 | Mayhall ............. | G11B 33/1426 |
| 2018/0017345 A1 | * | 1/2018 | Poltorak .................. | F28G 9/00 |

* cited by examiner

*Primary Examiner* — Adam B Dravininkas
(74) *Attorney, Agent, or Firm* — Wenderoth, Lind & Ponack, L.L.P.

(57) ABSTRACT

A device includes a hybrid heat sink, and a heat generation component. The hybrid heat sink is attached to the heat generation component. The hybrid heat sink includes a front plate and a rear plate. The front plate is connected to the rear plate by a wall. The front plate includes fins extending away from the front plate and toward the rear plate.

20 Claims, 8 Drawing Sheets

HYBRID HEAT SINK

TECHNICAL FIELD

The subject matter of the present disclosure relates generally to a hybrid heat sink and a device including the hybrid heat sink.

BACKGROUND

In devices that generate heat, air vents may be utilized by these devices to dissipate that heat. For example, an electronic device (e.g., wireless extender, cable modem, gateway device, set-top box (STB), customer premise equipment (CPE) device, etc.) may have one or more air vents that are designed to facilitate movement of air over one or more components of the electronic device.

The device may house electronic circuits that perform various functions such as forwarding signals between networks or converting signals from an input line into signals usable by end devices for displaying or playing data such as audio/video (A/V) media content including television programming and movies.

The electronic circuits may include circuit boards or panels on which interconnected circuits and other components are mounted or printed. Since components such as front end modules (FEMs) produce a substantial amount of heat, thermal management techniques are implemented for dissipation of the heat so as to protect the components from a degradation in operating performance or damage.

Existing solutions generally involve mounting a heat sink on top of a circuit board, thereby allowing heat to travel away from the circuit board so as to be dispersed into cooler air. However, in existing solutions, air flow may not be sufficient to dissipate enough heat to achieve optimum thermal performance. For example, traditional heat sinks may create a concentration of heat at one or more undesirable locations (e.g., heat may be concentrated at the front and top of an enclosure such that the front surface of a device is hotter than a rear surface of the device). Therefore, existing solutions only use one heat transfer method and fail to optimally dissipate heat.

Thus, it would be advantageous and an improvement over existing solutions to provide a hybrid heat sink that efficiently disperses heat away from higher-temperature components using both convection and conduction heat transfer methods.

SUMMARY

A hybrid heat sink for use with a device (such as in a modem) is disclosed in the present application.

The device comprises:
at least one hybrid heat sink; and
a heat generation component,
wherein:
the at least one hybrid heat sink is attached to the heat generation component;
the at least one hybrid heat sink includes a front plate, a rear plate and a wall;
the front plate is connected to the rear plate by the wall; and
the front plate includes a plurality of fins extending away from the front plate and toward the rear plate.

The hybrid heat sink described herein may include radiator fins that transfer heat to circulating air (convection) and conduct heat (conduction) with its extended metal body toward the back panel of an enclosure within which the hybrid heat sink is located. Using both heat transfer methods (convection and conduction), the thermal design of the hybrid heat sink is able to achieve required thermal performance. The hybrid heat sink spreads heat generated by a device over multiple sections (e.g., the top, front, and back panels) of an enclosure of the device.

BRIEF DESCRIPTION OF THE DRAWINGS

In the drawings, like reference numbers generally indicate identical, functionally similar, and/or structurally similar elements.

DETAILED DESCRIPTION

Exemplary embodiments will be described in detail below with reference to the drawings. The description and drawings are provided so that a person skilled in the art can fully understand the present disclosure and are not intended to limit the subject matter recited in the claims.

The hybrid heat sink and device disclosed herein use both heat transfer methods (convection and conduction) to achieve required thermal performance.

The hybrid heat sink and device disclosed herein address and solve the following problems:

How to provide maximum surface area for dissipating heat.

How to avoid trapping of heat underneath a heat sink.

How to prevent overheating of higher-temperature components of a circuit board.

How to prevent heat transfer to lower-temperature components of a circuit board underneath a heat sink.

How to leverage the solution to the above-mentioned problems in a heat sink with a minimal number of parts.

The hybrid heat sink and device disclosed herein solve the problems identified above and provide an efficient and cost effective solution to dispersing heat away from both higher-temperature components and lower-temperature components of a circuit board.

The hybrid heat sink disclosed herein transfers heat into colder air and releases the heat away from the circuit board.

Figure 1A:
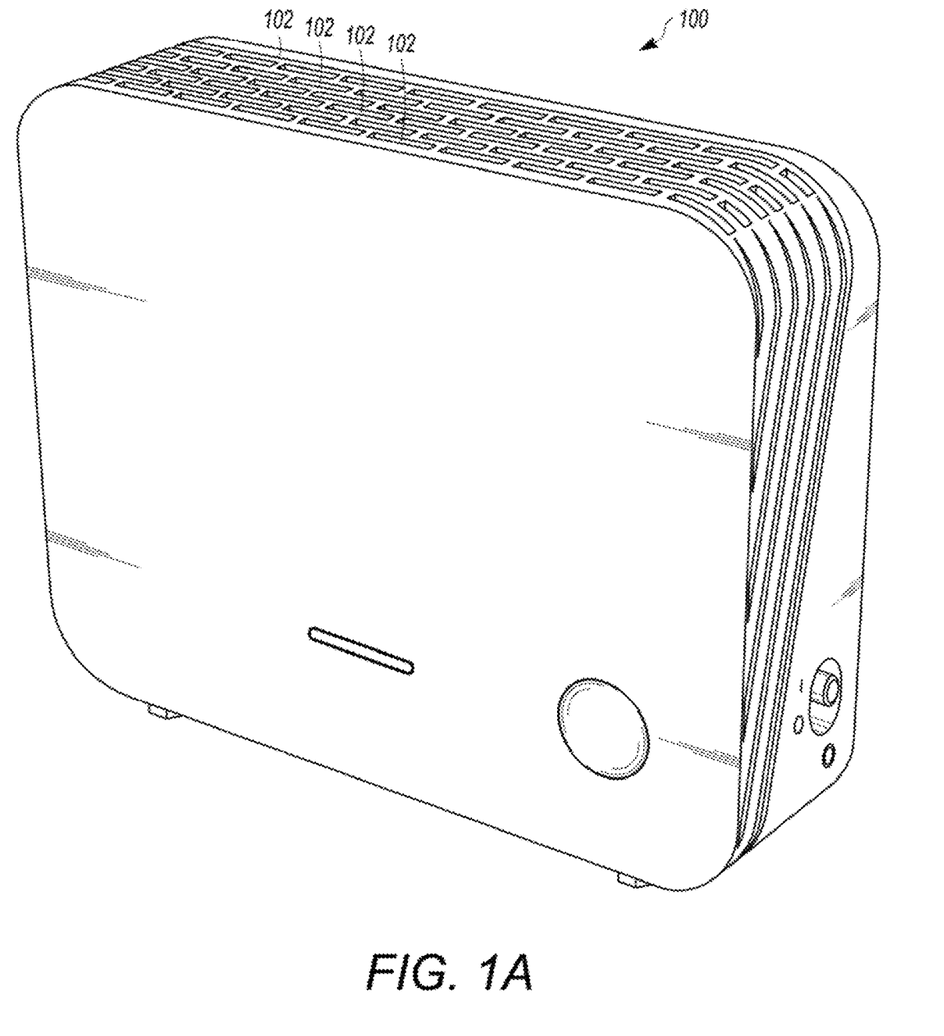
FIG. 1A shows a front perspective view of an example device according to the present disclosure.

Described herein is a hybrid heat sink that may be located in a device to facilitate heat transfer through both convection and conduction. FIG. 1A shows a front perspective view of an example device 100 having one or more top surface vent openings 102 located on the top surface of the enclosure of the device 100. The device 100 may be an electronic device that generates heat. For example, the device 100 may be a wireless extender, cable modem, gateway device, STB, CPE device, or any other device that generates heat. As shown in FIG. 1A, the device 100 may operate in an upright position when located on a horizontal surface.

Figure 1B:
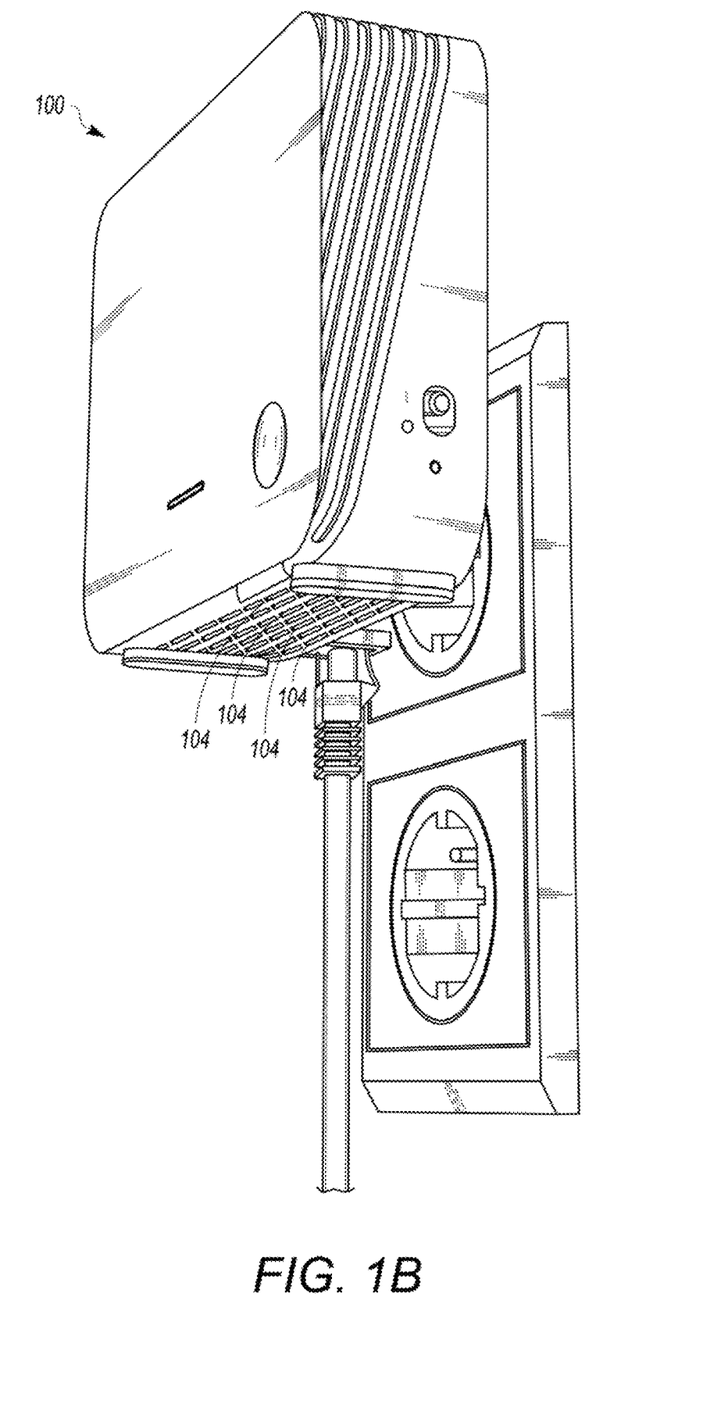
FIG. 1B shows another front perspective view of the example device according to the present disclosure.

FIG. 1B shows the device 100 attached to a vertical surface. For example, the device 100 may be plugged into a wall outlet such that the device 100 operates in an upright position. As shown in FIG. 1B, the device 100 may have one or more bottom surface vent openings 104 located on the bottom surface of the enclosure of the device 100.

Figure 1C:
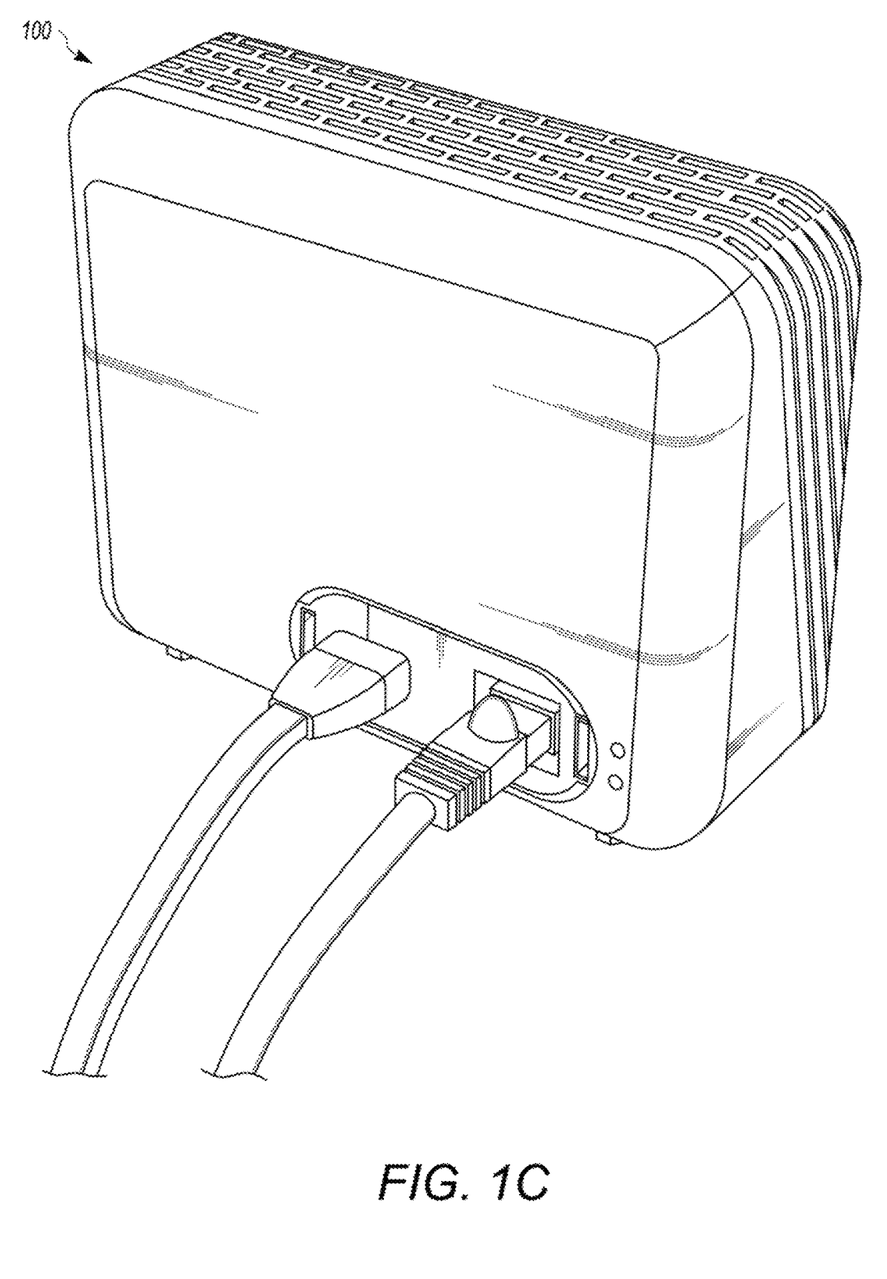
FIG. 1C is a rear perspective view of the example device according to the present disclosure.

FIG. 1C shows a rear perspective view of the device 100, wherein the device 100 is operating in an upright position and supported by a horizontal surface.

Figure 2A:
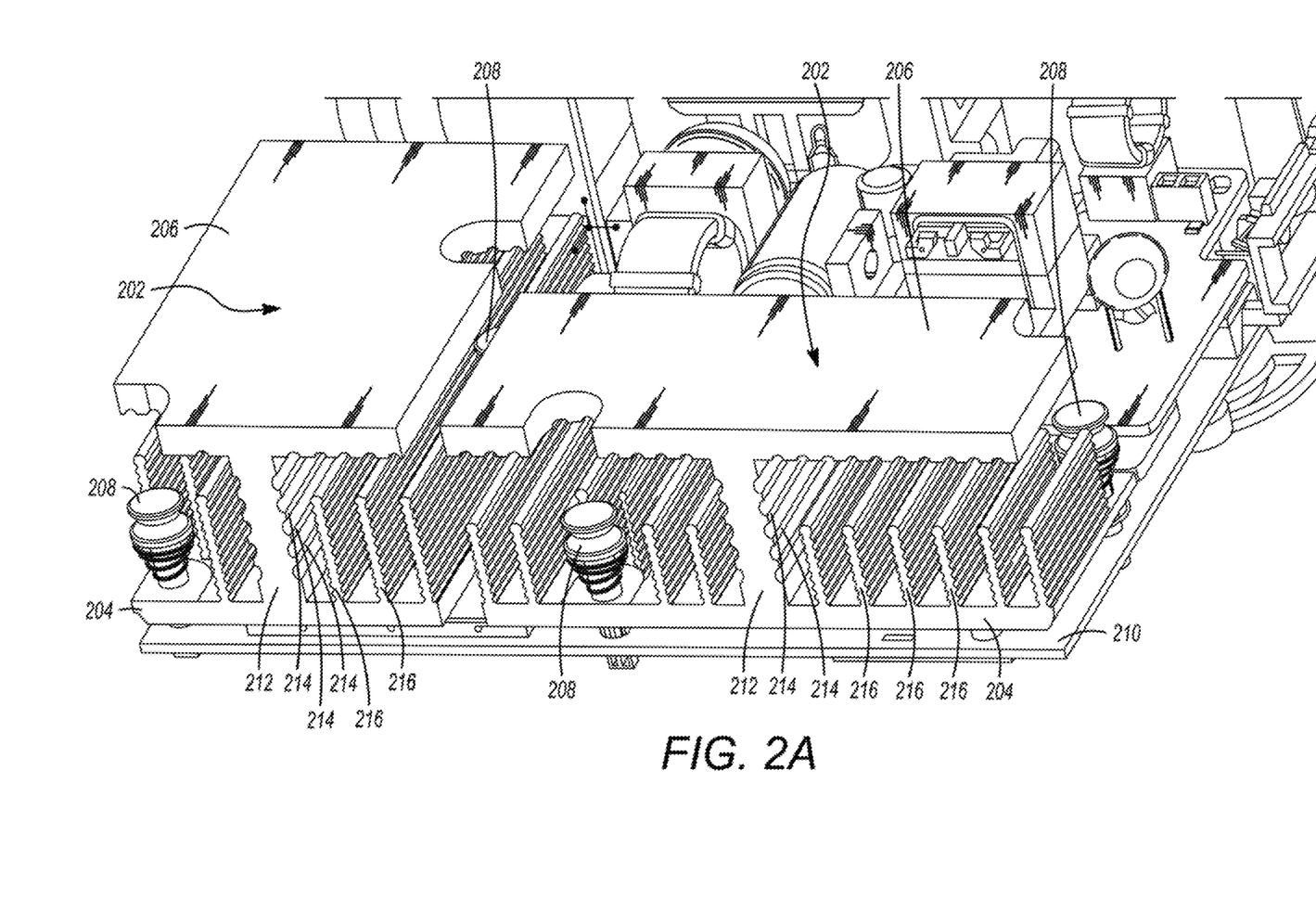
FIG. 2A is a perspective view of interior components of the example device according to the present disclosure.

FIG. 2A shows two hybrid heat sinks 202 attached to a heat generation component that is located within an enclosure of the device 100 of FIG. 1A. Each hybrid heat sink 202 may include a front plate 204 and a rear plate 206. The front plate 204 may face and/or be attached to a surface of a heat generation component. For example, each hybrid heat sink 202 may be secured by one or more spring screws 208 to a printed circuit board (PCB) comprising one or more heat generation integrated circuits (ICs). As shown in FIG. 2A, the front plate 204 may be connected to the rear plate 206 by a single wall 212. The front plate 204 may be connected to the rear plate 206 only by the single wall 212. The exterior surface of both sides of the wall 212 may include a plurality of ribs 214. The interior surface of the rear plate 206 and/or the front plate 204 may include a plurality of ribs 214. As shown in FIG. 2A, a plurality of fins 216 may extend away from the front plate 204 and toward the rear plate 206. The outer surface of each fin 216 may include a plurality of ribs 214. In some embodiments, the fins 216 of a hybrid heat sink 202 may be parallel with the wall 212 of the hybrid heat sink 202.

As shown in FIG. 2A, a first hybrid heat sink 202 may be situated along a top edge of the PCB 210, and a second hybrid heat sink 202 may be situated along a side edge of the PCB 210. It should be understood that one or more hybrid heat sinks 202 may be attached to the PCB 210 at various other positions and orientations than those shown in FIG. 2A. In some embodiments, the fins 216 and wall 212 of each hybrid heat sink 202 attached to the PCB 210 may extend along the front plate 204 parallel to a vertical axis (the vertical axis when the device 100 is in an upright position) of the PCB 210.

Figure 2B:
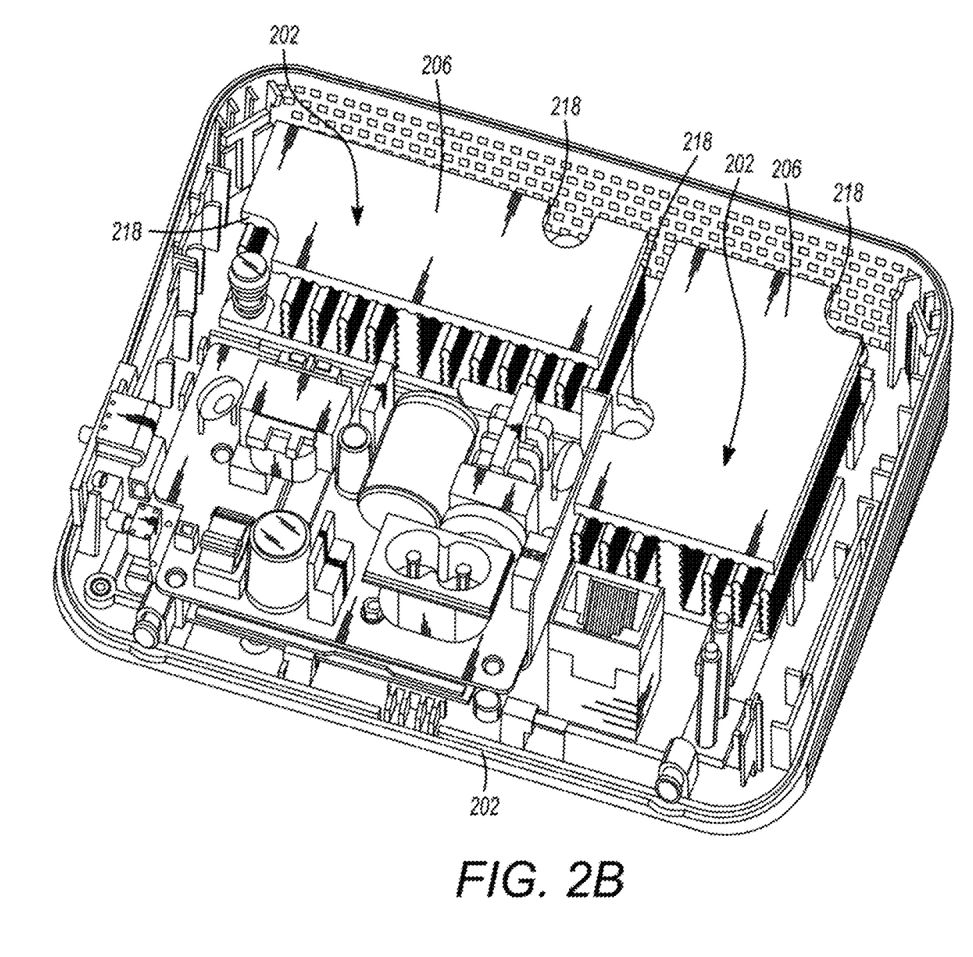
FIG. 2B is another perspective view of the interior components of the example device according to the present disclosure.

As can be seen in FIG. 2B, each of the one or more hybrid heat sinks 202 may include one or more cutouts 218 on the rear plate 206, thereby providing access to one or more screws (e.g., spring screws 208 of FIG. 2A).

Figure 3:
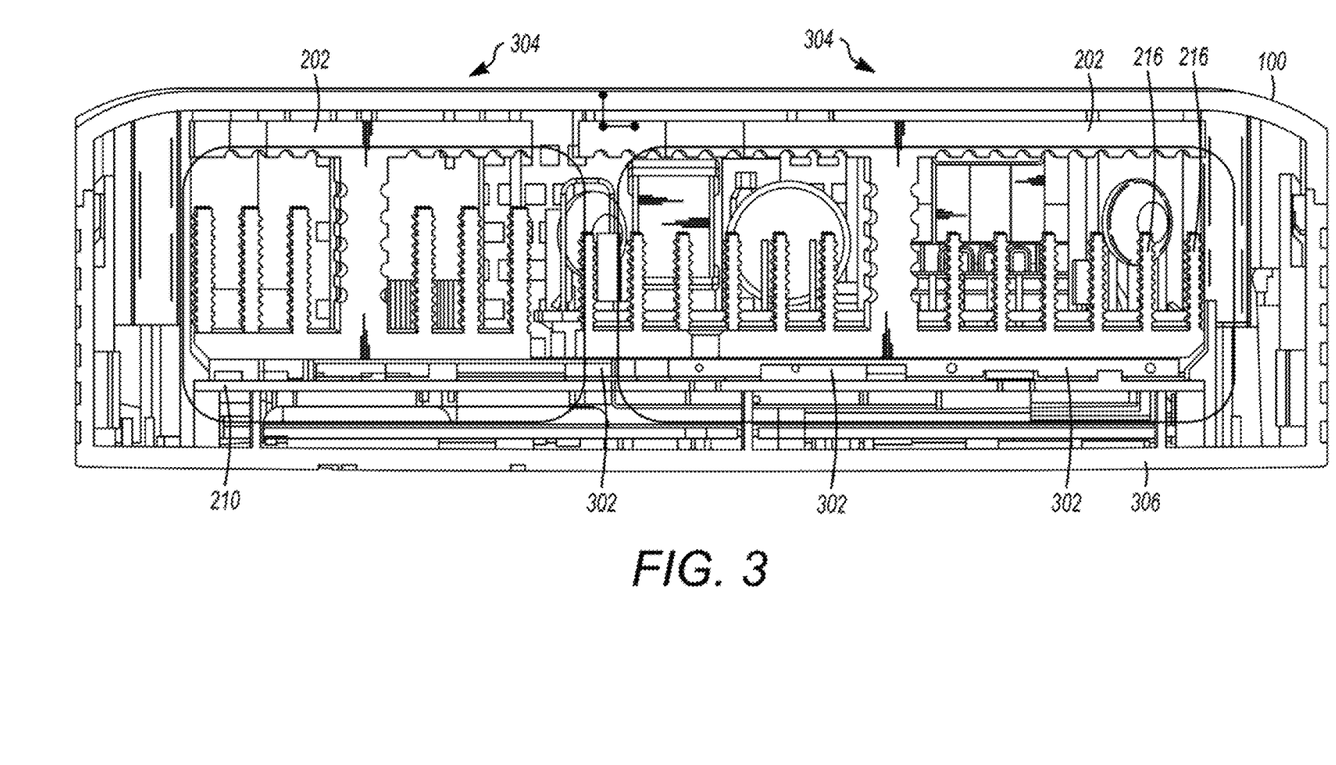
FIG. 3 is a top view of the example device according to the present disclosure.

FIG. 3 is a top view of a device 100 having two hybrid heat sinks 202 attached to a PCB 210. In some embodiments, one or more thermal pads 302 may be located in between the PCB 210 and one or more contact points of each hybrid heat sink 202. Each thermal pad 302 may make contact on one side with the PCB 210 and may make contact on the other side with a hybrid heat sink 202. The hybrid heat sinks 202 may facilitate a transfer of heat (e.g., through conduction cooling) from the front surface 304 of the device 100 (e.g., the surface nearest to the PCB 210) toward the rear surface 306 of the device 100. The flow of air over the fins 216 may facilitate a transfer of heat (e.g., through convection cooling) from the fins 216 to the flow of air.

Figure 4:
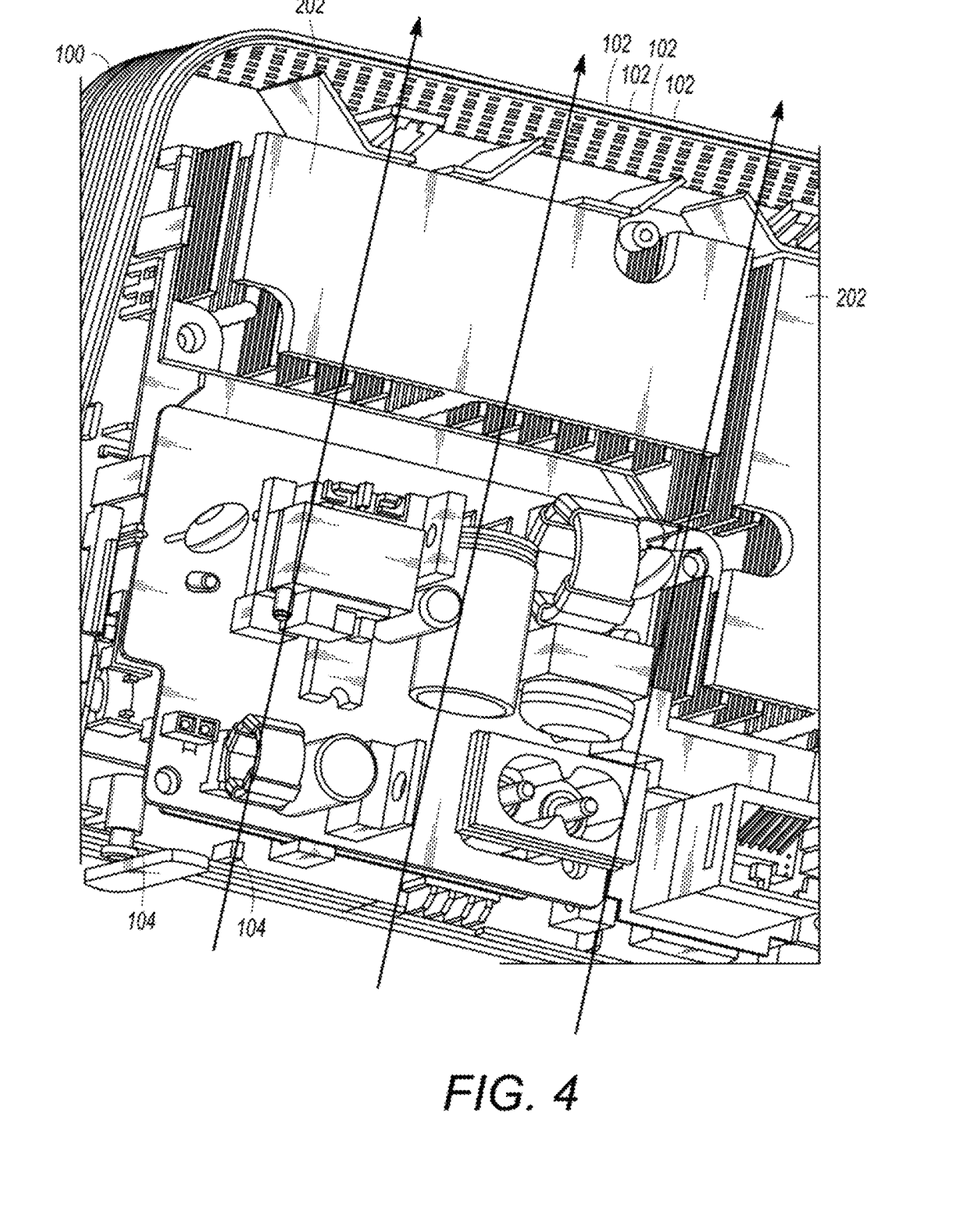
FIG. 4 is a rear view of the interior components of the example device according to the present disclosure.

FIG. 4 is a rear view of the interior components of the device 100, the device 100 having two hybrid heat sinks 202. The enclosure of the device 100 may have one or more top surface vent openings 102 located on the top surface of the enclosure of the device 100 and may have one or more bottom surface vent openings 104 located on the bottom surface of the enclosure of the device 100. Air flow may enter the enclosure of the device 100 through the bottom vent openings 104, pass over the fins (e.g., fins 216 of FIG. 2A) of the one or more hybrid heat sinks 202, and exit the enclosure of the device 100 through the top surface vent openings 102. Heat may be transferred from the one or more hybrid heat sinks 202 to the flow of air, and the flow of air may carry the heat to the outside of the enclosure of the device 100.

Figure 5:
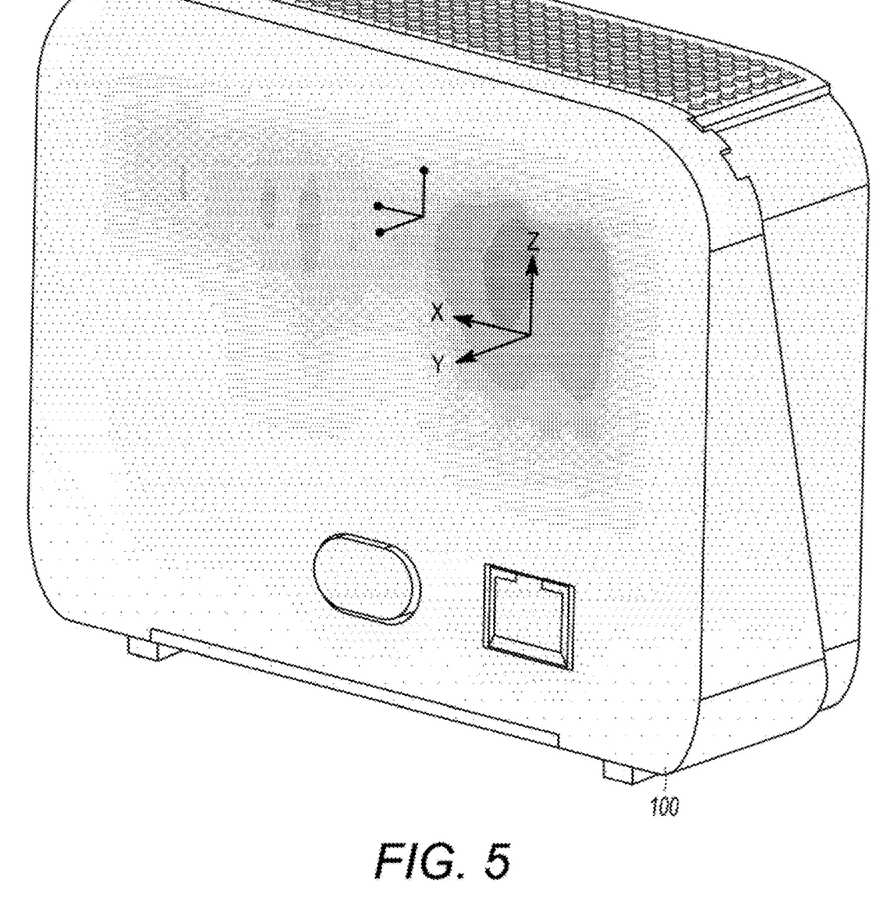
FIG. 5 shows a thermal, front perspective view of the example device according to the present disclosure.

FIG. 5 is a thermal view of the device 100 having one or more hybrid heat sinks (e.g., hybrid heat sinks 202 of FIG. 2A) within the enclosure of the device 100. As can be seen in FIG. 5, the hybrid heat sinks may facilitate a transfer of heat from the front surface of the enclosure to the rear surface of the enclosure.

The subject matter of the present disclosure is provided as examples of devices, systems, methods, and programs for performing the features described in the present disclosure. However, further features or variations are contemplated in addition to the features described above. It is contemplated that the implementation of the components and functions of the present disclosure can be done with any newly arising technology that may replace any of the above implemented technologies.

Additionally, the above description provides examples, and is not limiting of the scope, applicability, or configuration set forth in the claims. Changes may be made in the function and arrangement of elements discussed without departing from the spirit and scope of the disclosure. Various embodiments may omit, substitute, or add various procedures or components as appropriate. For instance, features described with respect to certain embodiments may be combined in other embodiments.

In view of the above, the hybrid heat sink and device disclosed herein solve the problems of existing solutions and provide an efficient and cost effective solution to disperse heat away from both higher-temperature components and lower-temperature components of a circuit board using multiple heat transfer methods.

We claim:

1. A device comprising:
    at least one hybrid heat sink; and
    a heat generation component,
    wherein:
    the at least one hybrid heat sink is attached to the heat generation component;
    the at least one hybrid heat sink includes a front plate, a rear plate and a wall;
    the front plate is connected to the rear plate by the wall;
    the front plate includes a plurality of fins extending away from the front plate and toward the rear plate;
    the wall is orthogonal to the front plate; and
    all of the fins are orthogonal to the front plate such that all of the fins are parallel to the wall.

2. The device of claim 1, wherein the front plate is only connected to the rear plate by the wall which is a single wall.

3. The device of claim 1, wherein an exterior surface of the wall includes a plurality of ribs.

4. The device of claim 1, wherein at least one of an interior surface of the front plate or an interior surface of the rear plate includes a plurality of ribs.

5. The device of claim 1, wherein an outer surface of each of the fins includes a plurality of ribs.

6. The device of claim 1, wherein:
    an exterior surface of the wall includes a plurality of ribs;
    an interior surface of the front plate includes a plurality of ribs;

an interior surface of the rear plate includes a plurality of ribs; and an outer surface of each of the fins includes a plurality of ribs.

7. The device of claim 1, wherein the wall is orthogonal to the rear plate.

8. The device of claim 1, wherein one or more cutouts are defined in the rear plate.

9. The device of claim 1, wherein the at least one hybrid heat sink is attached to the heat generation component by one or more spring screws.

10. The device of claim 1, wherein a surface vent opening is defined in at least one of a top surface of the device or a bottom surface of the device.

11. The device of claim 1, further comprising a thermal pad between the heat generation component and the at least one hybrid heat sink.

12. The device of claim 1, wherein the heat generation component is part of a printed circuit board (PCB).

13. A hybrid heat sink comprising:
a front plate;
a rear plate; and
a wall,
wherein:
the front plate is connected to the rear plate by the wall;
the front plate includes a plurality of fins extending away from the front plate and toward the rear plate;

the wall is orthogonal to the front plate; and
all of the fins are orthogonal to the front plate such that all of the fins are parallel to the wall.

14. The hybrid heat sink of claim 13, wherein the front plate is only connected to the rear plate by the wall which is a single wall.

15. The hybrid heat sink of claim 13, wherein an exterior surface of the wall includes a plurality of ribs.

16. The hybrid heat sink of claim 13, wherein at least one of an interior surface of the front plate or an interior surface of the rear plate includes a plurality of ribs.

17. The hybrid heat sink of claim 13, wherein an outer surface of each of the fins includes a plurality of ribs.

18. The hybrid heat sink of claim 13, wherein:
an exterior surface of the wall includes a plurality of ribs;
an interior surface of the front plate includes a plurality of ribs;
an interior surface of the rear plate includes a plurality of ribs; and
an outer surface of each of the fins includes a plurality of ribs.

19. The hybrid heat sink of claim 13, wherein the wall is orthogonal to the rear plate.

20. The hybrid heat sink of claim 13, wherein one or more cutouts are defined in the rear plate.

\* \* \* \* \*